US010312906B2

(12) United States Patent
Sato et al.

(10) Patent No.: US 10,312,906 B2
(45) Date of Patent: Jun. 4, 2019

(54) SWITCH APPARATUS

(71) Applicant: Asahi Kasei Microdevices Corporation, Tokyo (JP)

(72) Inventors: Kenichi Sato, Tokyo (JP); Atsuo Ito, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 21 days.

(21) Appl. No.: 15/701,447

(22) Filed: Sep. 12, 2017

(65) Prior Publication Data

US 2018/0083618 A1 Mar. 22, 2018

(30) Foreign Application Priority Data

Sep. 16, 2016 (JP) ................................ 2016-182248
Sep. 16, 2016 (JP) ................................ 2016-182307
Sep. 1, 2017 (JP) ................................ 2017-169023

(51) Int. Cl.

*H03K 17/687* (2006.01)
*H03K 17/693* (2006.01)
*H03K 17/0412* (2006.01)
*H03K 17/10* (2006.01)
*H03K 17/16* (2006.01)
*H03K 17/30* (2006.01)

(52) U.S. Cl.

CPC ....... *H03K 17/693* (2013.01); *H03K 17/0412* (2013.01); *H03K 17/102* (2013.01); *H03K 17/162* (2013.01); *H03K 17/166* (2013.01); *H03K 17/6874* (2013.01); *H03K 2017/307* (2013.01); *H03K 2017/6878* (2013.01); *H03K 2217/0018* (2013.01); *H03K 2217/0054* (2013.01)

(58) Field of Classification Search

CPC .................................................... H03K 17/693
USPC .......................................................... 327/427
See application file for complete search history.

(56) References Cited

U.S. PATENT DOCUMENTS 5,172,019 A 12/1992 Naylor et al.
6,154,085 A 11/2000 Ramakrishnan
6,329,848 B1 * 12/2001 Maes .................. G11C 27/024 327/534

(Continued)

FOREIGN PATENT DOCUMENTS

JP H01-136414 A 5/1989
JP H01-175410 A 7/1989
JP H09-283756 A 10/1997

*Primary Examiner* — Metasebia T Retebo

(57) ABSTRACT

A switch apparatus is provided, including: a main switch connected between first and second terminals, and electrically connecting or disconnecting the first and second terminals according to gate voltage applied to a gate terminal; a voltage output unit having a voltage divider including a first voltage-division resistance on the first terminal side and a second voltage-division resistance on the second terminal side, and outputting voltage corresponding to voltage of the first terminal and voltage of the second terminal if the main switch is caused to enter a connected state; a buffer outputting voltage following output voltage of the voltage output unit in a connected state of the main switch; and a switch control circuit supplying first voltage corresponding to output voltage of the buffer to the gate terminal, and supplying a second voltage corresponding to output voltage of the buffer to a bulk terminal of the main switch.

13 Claims, 11 Drawing Sheets

22
24
B
S
D
210
220
230
240
26
VOLTAGE OUTPUT UNIT
BUFFER
SWITCH CONTROL CIRCUIT
200

(56) References Cited

U.S. PATENT DOCUMENTS

| | | | |
|---|---|---|---|
| 8,004,340 | B2 | 8/2011 | Guo et al. |
| 8,115,518 | B1 | 2/2012 | Ali |
| 8,547,159 | B2 | 10/2013 | Morra |
| 2008/0296685 | A1 | 12/2008 | Sonehara et al. |

* cited by examiner

220

SWITCH APPARATUS

The contents of the following Japanese patent application(s) are incorporated herein by reference:

NO. 2016-182248 filed on Sep. 16, 2016,

NO. 2016-182307 filed on Sep. 16, 2016, and

NO. 2017-169023 filed on Sep. 1, 2017.

BACKGROUND

1. Technical Field

The present invention relates to a switch apparatus.

2. Related Art

Conventionally, it has been known to keep, in a semiconductor switch such as a MOSFET, gate-source voltage at approximately constant voltage using a level shifter and reduce variations of an ON-resistance (please see Patent Document 1, for example).

Patent Document 1: U.S. Pat. No. 8,004,340

However, because semiconductor switches such as a MOSFET have a junction capacitance, and the junction capacitance varies according to the signal intensity of an input signal, distortion may be generated to signals sometimes. Accordingly, a switch apparatus with reduced variations in an ON-resistance and junction capacitance of a MOSFET has been desired.

SUMMARY

Therefore, it is an object of an aspect of the innovations herein to provide a switch apparatus, which is capable of overcoming the above drawbacks accompanying the related art. The above and other objects can be achieved by combinations described in the claims. In other words, a first aspect of the present invention provides a switch apparatus including: a main switch that is connected between a first terminal and a second terminal and electrically connects or disconnects the first terminal and the second terminal according to gate voltage applied to a gate terminal; a voltage output unit that has a voltage divider including a first voltage-division resistance on the first terminal side and a second voltage-division resistance on the second terminal side, and outputs voltage corresponding to voltage of the first terminal and voltage of the second terminal if the main switch is caused to enter a connected state; a buffer that outputs voltage following output voltage of the voltage output unit in a connected state of the main switch; and a switch control circuit that supplies first voltage corresponding to output voltage of the buffer to the gate terminal, and supplies a second voltage corresponding to output voltage of the buffer to a bulk terminal of the main switch.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiments do not limit the invention according to the claims, and all the combinations of the features described in the embodiments are not necessarily essential to means provided by aspects of the invention.

Figure 1:
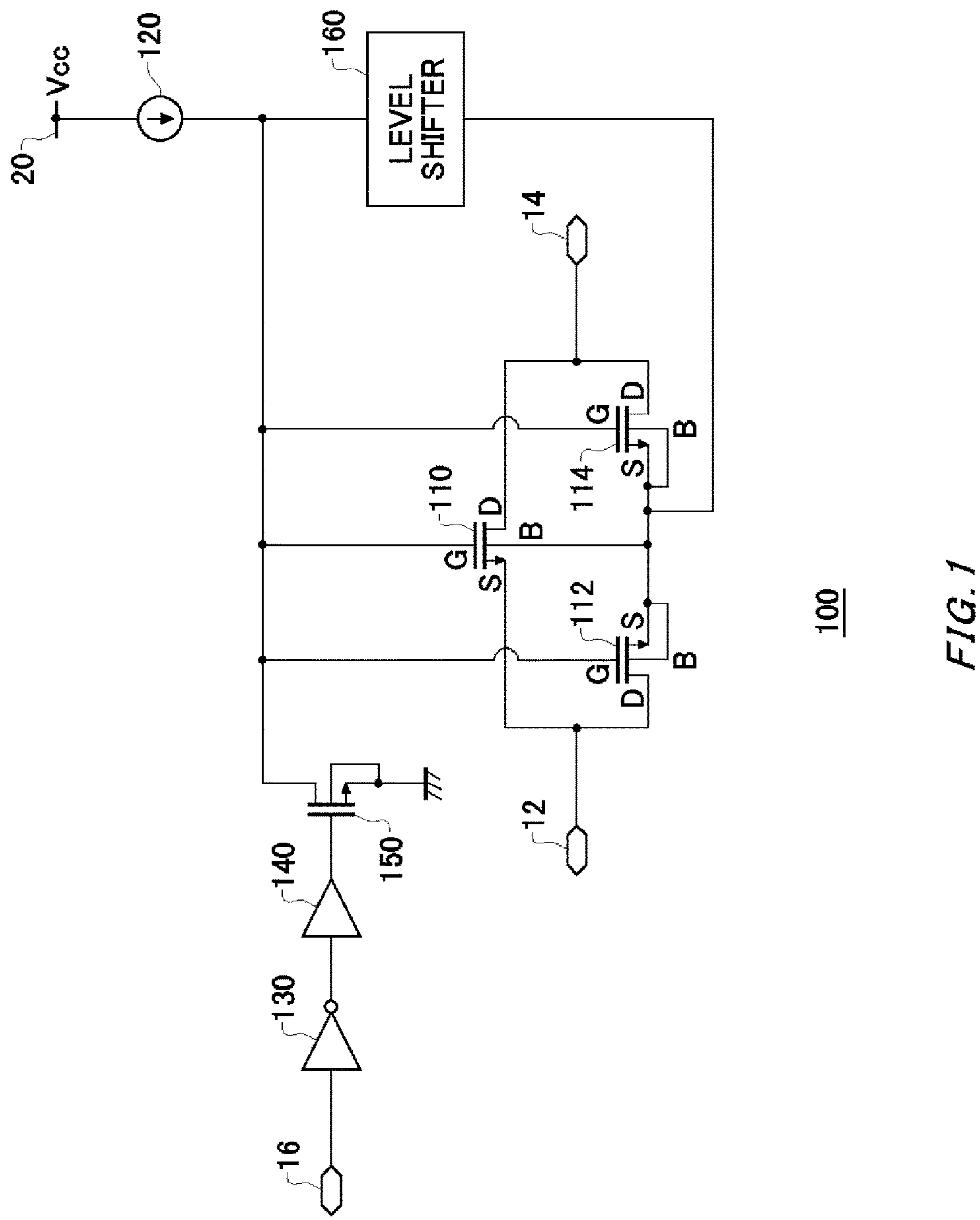
FIG. 1 shows a configuration example of a switch apparatus 100.

FIG. 1 shows a configuration example of a switch apparatus 100. The switch apparatus 100 performs control to keep gate-source voltage of a semiconductor switch approximately constant to keep an ON-resistance of the semiconductor switch at an approximately constant value. The switch apparatus 100 includes a first terminal 12, a second terminal 14, a third terminal 16, a power source unit 20, a main switch 110, a first sub-switch 112, a second sub-switch 114, a current source 120, an inverter 130, a logical level shifter 140, a third sub-switch 150 and a level shifter 160.

The first terminal 12 and the second terminal 14 are connected to one end and the other end of the main switch 110, respectively, and transmit an electrical signal if the main switch 110 is in a connected state. The first terminal 12 and the second terminal 14 are connected with a source of transmission, destination of transmission, or the like of an electrical signal, for example. One of the first terminal 12 and the second terminal 14 functions as an input terminal for an electrical signal, for example, and in this case the other terminal functions as an output terminal.

The third terminal 16 receives an input of a control signal to control the switch apparatus 100. That is, the switch apparatus 100 electrically connects or disconnects the first terminal 12 and the second terminal 14 according to a control signal input through the third terminal 16. The power source unit 20 outputs predetermined voltage. The power source unit 20 may supply power source voltage of the switch apparatus 100, and in this case supplies voltage to each unit of the switch apparatus 100.

The main switch 110 is connected between the first terminal 12 and the second terminal 14, and electrically connects or disconnects the first terminal 12 and the second terminal 14 according to gate voltage applied to its gate terminal (G). The main switch 110 may be an n-channel MOSFET, or instead of this may be a p-channel MOSFET. FIG. 1 shows an example in which the main switch 110 is an n-channel MOSFET.

As one example, the main switch 110 has a source terminal (S) connected to the first terminal 12 and a drain terminal (D) connected to the second terminal 14. As one example, the source terminal and/or bulk terminal (B) of the main switch 110 is/are connected to the ground (GND) potential such as 0V. The main switch 110 electrically connects or disconnects the drain terminal and source terminal according to gate-source voltage.

The first sub-switch 112 is connected between the first terminal 12 and the bulk terminal of the main switch 110, and electrically connects or disconnects the first terminal 12 and the bulk terminal of the main switch 110 according to gate voltage applied to its gate terminal. The second sub-switch 114 is connected between the bulk terminal of the main switch 110 and the second terminal 14, and electrically connects or disconnects the bulk terminal of the main switch 110 and the second terminal 14 according to gate voltage applied to its gate terminal.

The first sub-switch 112 and the second sub-switch 114 may be n-channel MOSFETs, or instead of this may be p-channel MOSFETs. The gate terminals of the main switch 110, the first sub-switch 112 and the second sub-switch 114 are desirably MOSFETs of the same polarity. FIG. 1 shows an example in which the first sub-switch 112 and the second sub-switch 114 are n-channel MOSFETs. As one example, the drain terminal of the first sub-switch 112 is connected to the first terminal 12, and its source terminal is connected to the bulk terminal of the main switch 110. Also, the source terminal of the second sub-switch 114 is connected to the bulk terminal of the main switch 110, and its drain terminal is connected to the second terminal 14.

The gate terminals of the main switch 110, the first sub-switch 112 and the second sub-switch 114 are connected to each other, and approximately the same gate voltage is supplied thereto. That is, the main switch 110, the first sub-switch 112 and the second sub-switch 114 are switched to either a connected state or a disconnected state according to a control signal. Accordingly, a transmission path through the main switch 110 and a transmission path through the first sub-switch 112 and the second sub-switch 114 are formed between the first terminal 12 and the second terminal 14 if they enter a connected state.

The current source 120 allows predetermined constant current to flow. The inverter 130 reverses the logic of a control signal input through the third terminal 16. Also, the logical level shifter 140 shifts the output level of the inverter 130. The third sub-switch 150 is connected between the gate terminal of the main switch 110 and the ground potential, and electrically connects or disconnects the gate terminal of the main switch 110 and the ground potential according to an output of the logical level shifter 140. As one example, the third sub-switch 150 is an n-channel MOSFET.

The level shifter 160 is provided between the gate terminal and bulk terminal of the main switch 110, and generates a predetermined potential difference between the gate terminal and bulk terminal of the main switch 110 according to an input of current. Here, the predetermined potential difference is a potential difference equal to or larger than gate-source voltage that causes the main switch 110 to enter a connected state. That is, corresponding to the level shifter 160 generating the predetermined potential difference, the main switch 110, the first sub-switch 112 and the second sub-switch 114 are switched to a connected state.

As one example, the level shifter 160 has one end connected to the gate terminal of the main switch 110 and the current source 120, and the other end connected to the bulk terminal of the main switch 110, and generates a predetermined potential difference between the one end and the other end according to current input from the current source 120. In this case, the level shifter 160 may stop generation of a potential difference corresponding to the voltage at the one end side being approximately 0V.

For example, the inverter 130 and the logical level shifter 140 supply, to the gate electrode of the third sub-switch 150, a low potential signal according to a control signal (as one example, high potential) to cause the main switch 110 to enter a connected state. Thereby, the third sub-switch 150 electrically disconnects the gate terminal of the main switch 110 and the ground potential. Because thereby the current source 120 causes approximately constant current to flow to the level shifter 160, the main switch 110, the first sub-switch 112 and the second sub-switch 114 can be switched to a connected state.

Also, the inverter 130 and the logical level shifter 140 supply, to the gate electrode of the third sub-switch 150, high potential signal according to a control signal (as one example, low potential) to cause the main switch 110 to enter a disconnected state. Thereby, the third sub-switch 150 electrically connects the gate terminal of the main switch 110 and the ground potential to make the gate voltage of the main switch 110 approximately 0V. Because thereby the current source 120 causes approximately constant current to flow to the ground, current is not supplied to the level shifter 160, and the gate-source voltage of the main switch 110 becomes approximately 0V, and it enters a disconnected state. Likewise, the first sub-switch 112 and the second sub-switch 114 enter a disconnected state.

As mentioned above, the switch apparatus 100 can switch the main switch 110 to either a connected state or a disconnected state according to a control signal. Also, because the switch apparatus 100 makes the gate-source voltage of the main switch 110 approximately constant voltage to cause it to enter a connected state, even if voltage of the first terminal 12 or the second terminal 14 varies, an ON-resistance can be kept at an approximately constant value.

However, the switch apparatus 100 has the main switch 110, the first sub-switch 112 and the second sub-switch 114 between the first terminal 12 and the second terminal 14, and if the first terminal 12 and the second terminal 14 are electrically connected, these multiple switches enter a connected state. It has been known to form such a main switch 110, first sub-switch 112 and second sub-switch 114 electrically separately from the semiconductor substrate on a well region formed by PN junction or the like.

In this case, a parasitic junction capacitance is formed to be loads for the first terminal 12 and the second terminal 14. If such a junction capacitance exists, variations in potential of the first terminal 12 and the second terminal 14 correspondingly result in variations in load capacitances for the first terminal 12 and the second terminal 14. For example, because if an analog signal is input through the first terminal 12, and the second terminal 14 is caused to receive the analog signal using a load connected to the second terminal, the load capacitance varies according to the signal intensity of the analog signal, distortion is generated to the received analog signal, and the signal waveform may be degraded in some cases.

Also, because in the switch apparatus 100, the other end of the level shifter 160 is connected to the source terminals of the first sub-switch 112 and the second sub-switch 114, current flows into a transmitted analog signal. Here, current to flow to the level shifter 160 is current supplied by the current source 120, but if higher harmonic noises or the like of an electrical signal are superimposed on this current source 120, the higher harmonic noises are mixed in an analog signal, and the signal waveform of the analog signal may be degraded.

Such degradation of a signal waveform becomes significant if a dumping resistance or the like is provided on the first terminal 12 side of a transmitting side, for example. It has been known to make the W/L ratio of a MOS transistor high, and lower an ON-resistance for the purpose of reducing such distortion to be superimposed on an analog signal. Here, L is a channel length. It has been known to increase a channel width W because the channel length has its lower limit.

However, if high-quality audio signals are handled, transmission of less distorted signals at the level of −130 dB or lower is required in some cases for example, and it has been difficult to realize distortion reduction by adjustment of the W/L ratio of a transistor. Also, it has been difficult to reduce higher harmonic noises or the like to be mixed in from the current source 120. In view of this, a switch apparatus 200 according to the present embodiment reduces the ON-resistance, and reduces distortion to be superimposed on a transmitted signal, and at the same time, allows sure execution of switching operations corresponding to a control signal. Such a switch apparatus 200 is explained next.

Figure 2:
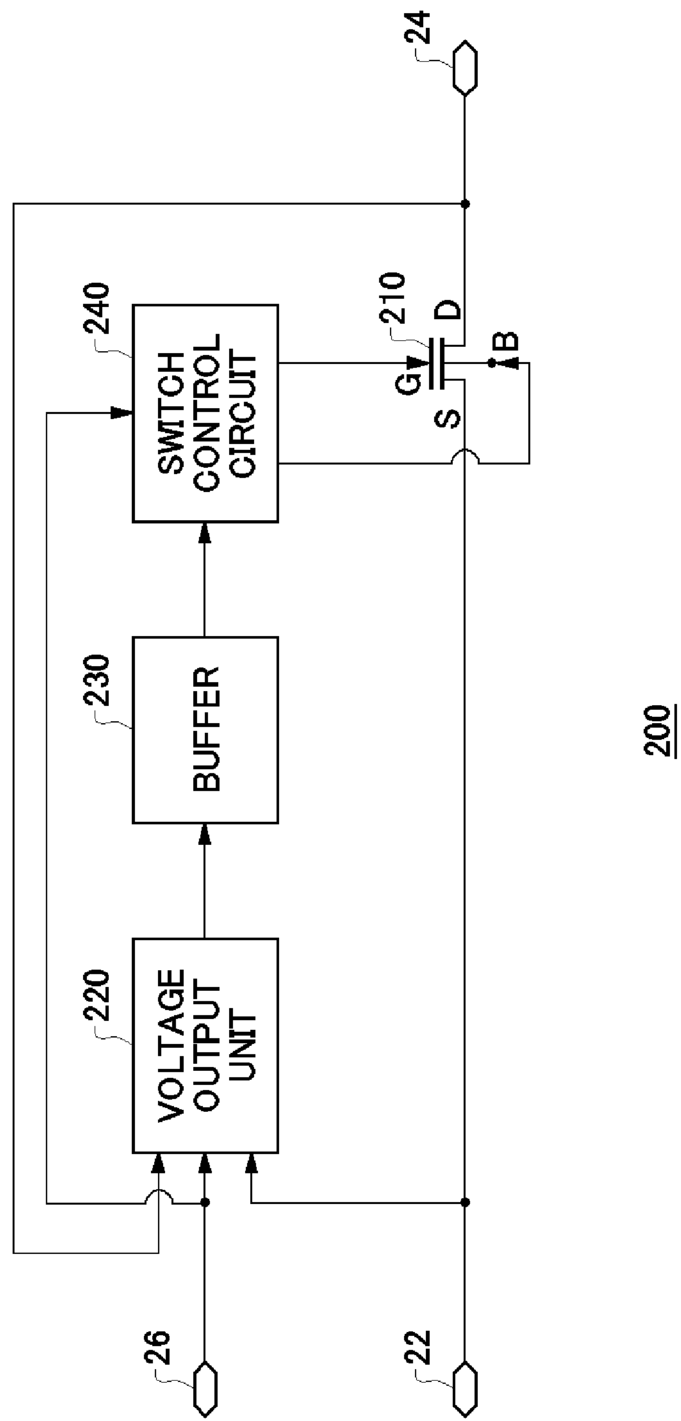
FIG. 2 shows a configuration example of a switch apparatus 200 according to the present embodiment.

FIG. 2 shows a configuration example of the switch apparatus 200 according to the present embodiment. The switch apparatus 200 controls the gate voltage according to signal voltage of an input electrical signal to reduce distortion to be superimposed on a transmitted signal. The switch apparatus 200 includes a first terminal 22, a second terminal 24, a third terminal 26, a main switch 210, a voltage output unit 220, a buffer 230 and a switch control circuit 240.

The first terminal 22 and the second terminal 24 are connected to one end and the other end of the main switch 210, respectively, and transmit an electrical signal if the main switch 210 is in a connected state. The first terminal 22 and the second terminal 24 are connected with a source of transmission, destination of transmission, or the like of an electrical signal, for example. One of the first terminal 22 and the second terminal 24 functions as an input terminal for an electrical signal, for example, and in this case the other terminal functions as an output terminal.

The third terminal 26 receives an input of a control signal to control the switch apparatus 200. That is, the switch apparatus 200 electrically connects or disconnects the first terminal 22 and the second terminal 24 according to a control signal input through the third terminal 26.

The main switch 210 is connected between the first terminal 22 and the second terminal 24, and electrically connects or disconnects the first terminal 22 and the second terminal 24 according to gate voltage applied to its gate terminal (G). The main switch 210 is a semiconductor switch such as a FET. As one example, the main switch 210 has a drain terminal (D) connected to the second terminal 24, and a source terminal (S) connected to the first terminal 22. The main switch 210 electrically connects or disconnects the drain terminal and source terminal according to gate-source voltage. Also, the main switch 210 further has a bulk terminal (back gate terminal, B).

In the present embodiment, the main switch 210 is explained, for example, as a normally-off n-type semiconductor switch that electrically connects the drain terminal and source terminal corresponding to the gate terminal having ON-potential (high potential). In this case, the main switch 210 is desirably an n channel MOSFET. Also, the main switch 210 is desirably provided in a p-well on a substrate surface of a semiconductor substrate or the like.

If the main switch 210 is caused to enter a connected state, the voltage output unit 220 outputs voltage corresponding to voltage of the first terminal 22 and voltage of the second terminal 24. The voltage output unit 220 is connected to the first terminal 22, the second terminal 24 and the third terminal 26 for example, and supplies, to the buffer 230, voltage corresponding to voltage of the first terminal 22, voltage of the second terminal 24 and a control signal.

If the main switch 210 is in a connected state, the buffer 230 outputs voltage following voltage corresponding to at least one of voltage of the first terminal 22 and voltage of the second terminal 24. The buffer 230 supplies, to the switch control circuit 240, voltage following output voltage of the voltage output unit 220.

The switch control circuit 240 supplies, to the gate terminal of the main switch 210, first voltage corresponding to output voltage of the buffer 230. Also, the switch control circuit 240 supplies, to the bulk terminal of the main switch 210, second voltage corresponding to output voltage of the buffer 230. If the main switch 210 is caused to enter a connected state, the switch control circuit 240 supplies, to the gate terminal of the main switch 210, the first voltage obtained by adding non-zero offset voltage to the second voltage supplied to the bulk terminal of the main switch 210. Also, if the main switch 210 is caused to enter a disconnected state, the switch control circuit 240 supplies, to the gate terminal of the main switch 210, the first voltage which is the same as the second voltage supplied to the bulk terminal of the main switch 210.

The above-mentioned switch apparatus 200 supplies, to the gate electrode of the main switch 210, gate voltage corresponding to signal voltage of an electrical signal that the main switch 210 transmits. The gate voltage that the switch apparatus 200 supplies to the gate electrode of the main switch 210 is explained next together with details of each unit.

Figure 3:
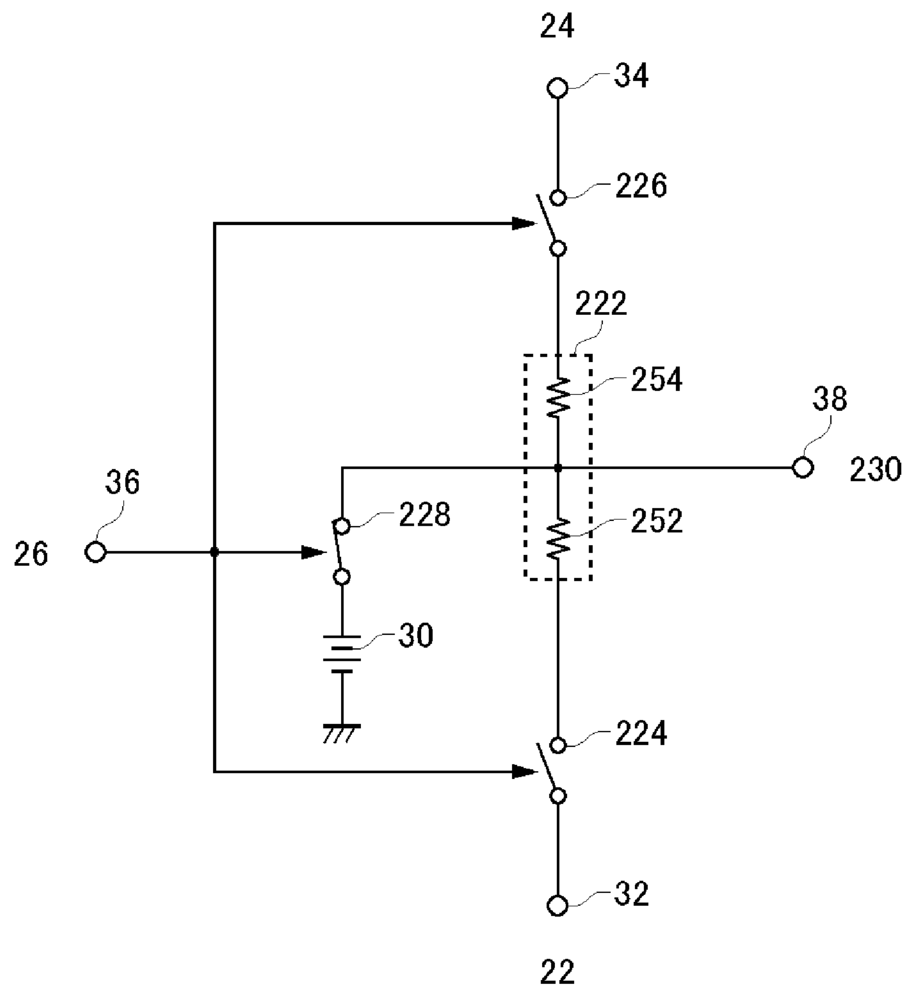
FIG. 3 shows a configuration example of a voltage output unit 220 according to the present embodiment.

FIG. 3 shows a configuration example of the voltage output unit 220 according to the present embodiment. The voltage output unit 220 has a reference potential generating unit 30, a first input terminal 32, a second input terminal 34, a third input terminal 36, an intermediate terminal 38, a voltage divider 222, a first sub-switch 224, a second sub-switch 226 and a third sub-switch 228.

The reference potential generating unit 30 generates first reference potential to be a reference for the switch apparatus 200. The reference potential generating unit 30 generates, as the first reference potential, potential that causes the main switch 210 to enter an OFF-state for example. The first reference potential may be potential to cause a diode formed between the source terminal and bulk terminal of the main switch 210 to enter an OFF-state. The reference potential generating unit 30 generates, as the first reference potential, potential equal to or lower than the lower limit value of a voltage range of an electrical signal that the main switch 210 transmits. As one example, the reference potential generating unit 30 generates, as the first reference potential, potential of −3V or lower if transmitting, between the first terminal 22 and the second terminal 24, a sinusoidal signal (3·sin(t) having amplitude voltage of 3V with 0V as its reference. Here, the first reference potential is \T$_{OFF}$.

The first input terminal 32 is connected with the first terminal 22, and receives an input of a signal to be input through the source terminal of the main switch 210 or a signal to be output through the source terminal. The second input terminal 34 is connected with the second terminal 24, and receives an input of a signal to be input through the drain terminal of the main switch 210 or a signal to be output through the drain terminal. The third input terminal 36 is connected with the third terminal 26, and receives an input of a control signal. The intermediate terminal 38 outputs an output of the voltage output unit 220 to the buffer 230.

The voltage divider 222 is provided between the first input terminal 32 and the second input terminal 34. If the main switch 210 is caused to enter a connected state, the voltage divider 222 divides voltage of the source terminal of the main switch 210 and voltage of its drain terminal. The voltage divider 222 includes a first voltage-division resistance 252 on the first terminal 22 side and a second voltage-division resistance 254 on the second terminal 24 side.

The first voltage-division resistance 252 is a voltage-division resistance connected to the first terminal 22 side. The first voltage-division resistance 252 has one end connected to the first input terminal 32 side, and the other end connected to the second voltage-division resistance 254. Here, a resistance value of the first voltage-division resistance 252 is $R_1$. The second voltage-division resistance 254 is a voltage-division resistance connected to the second terminal 24 side. The second voltage-division resistance 254 has one end connected to the other end of the first voltage-division resistance 252, and the other end connected to the second input terminal 34 side. Here, a resistance value of the second voltage-division resistance 254 is $R_2$.

The first voltage-division resistance 252 and the second voltage-division resistance 254 desirably have approximately the same resistance values. In this case, the voltage divider 222 divides voltage between the first terminal 22 and the second terminal 24 at a ratio of approximately 1:1. The intermediate terminal 38 is connected between the first voltage-division resistance 252 and the second voltage-division resistance 254, and outputs resultant voltage obtained after voltage-division by the voltage divider 222 to the buffer 230.

The first sub-switch 224 is provided between the first terminal 22 and the first voltage-division resistance 252, and enters a connected state if the main switch 210 is caused to enter a connected state, and enters a disconnected state if the main switch 210 is caused to enter a disconnected state. That is, the first sub-switch 224 switches whether or not to electrically connect one end of the first voltage-division resistance 252 and the first input terminal 32 according to a control signal input through the third input terminal 36.

The second sub-switch 226 is provided between the second terminal 24 and the second voltage-division resistance 254, and enters a connected state if the main switch 210 is caused to enter a connected state, and enters a disconnected state if the main switch 210 is caused to enter a disconnected state. That is, the second sub-switch 226 switches whether or not to electrically connect the other end of the second voltage-division resistance 254 and the second input terminal 34 according to a control signal input through the third input terminal 36.

Instead of this, the first sub-switch 224 may be provided between the intermediate terminal 38 and the first voltage-division resistance 252. That is, according to a control signal input through the third input terminal 36, the first sub-switch 224 switches whether or not to convey an electrical signal input through the first input terminal 32 to the intermediate terminal 38. Likewise, the second sub-switch 226 may be provided between the intermediate terminal 38 and the second voltage-division resistance 254. That is, according to a control signal input through the third input terminal 36, the second sub-switch 226 switches whether or not to convey an electrical signal input through the second input terminal 34 to the intermediate terminal 38.

The third sub-switch 228 is connected between a portion between the first voltage-division resistance 252 and the second voltage-division resistance 254 and the reference potential generating unit 30, and enters a connected state if the main switch 210 is caused to enter a disconnected state, and enters a disconnected state if the main switch 210 is caused to enter a connected state. That is, the third sub-switch 228 switches whether or not to electrically connect the portion between the first voltage-division resistance 252 and the second voltage-division resistance 254 and the reference potential generating unit 30 according to a control signal.

For example, if the main switch 210 is caused to enter a disconnected state, the third sub-switch 228 supplies first reference potential $V_{OFF}$ to the intermediate terminal 38 between the first voltage-division resistance 252 and the second voltage-division resistance 254. Also, if the main switch 210 is caused to enter a connected state, the third sub-switch 228 electrically disconnects the portion between the first voltage-division resistance 252 and the second voltage-division resistance 254 and the reference potential generating unit 30. Thereby, voltage obtained after voltage-division by the voltage divider 222 is output through the intermediate terminal 38. In this case, if voltage output through the intermediate terminal 38 is $V_M$, the voltage $V_M$ can be expressed as shown in the following equation.

$$\begin{aligned} V_M &= V_1 \cdot R_2/(R_1+R_2) + V_2 \cdot R_1/(R_1+R_2) \\ &= (V_1+V_2)/2 (\text{connected state}) \\ V_M &= V_{OFF} (\text{disconnected state}) \end{aligned} \qquad \text{(Equation 1)}$$

Here, voltage of the first terminal 22 is $V_1$, and voltage of the second terminal 24 is $V_2$. Also, $R_1=R_2$. The first sub-switch 224, the second sub-switch 226 and the third sub-switch 228 are desirably semiconductor switches.

As mentioned above, the voltage output unit 220 supplies, from the intermediate terminal 38 to the buffer 230, voltage obtained after voltage-division by the voltage divider 222 according to a control signal to cause the main switch 210 to enter a connected state. Also, the voltage output unit 220 supplies, from the intermediate terminal 38 to the buffer 230, the first reference potential $V_{OFF}$ of the reference potential generating unit 30 according to a control signal to cause the main switch 210 to enter a disconnected state. The buffer 230 is explained next.

Figure 4:
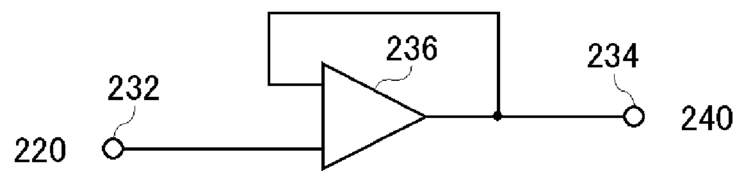
FIG. 4 shows a configuration example of a buffer 230 according to the present embodiment.

FIG. 4 shows a configuration example of the buffer 230 according to the present embodiment. The buffer 230 outputs, to the switch control circuit 240, voltage following the voltage $V_M$ from the intermediate terminal 38 of the voltage output unit 220. The buffer 230 has a fourth input terminal 232, a first output terminal 234 and an amplifying unit 236.

The fourth input terminal 232 is connected to the intermediate terminal 38 of the voltage output unit 220, and receives output voltage of the voltage divider 222 of the voltage output unit 220. The first output terminal 234 outputs the output of the buffer 230 to the switch control circuit 240.

The amplifying unit 236 amplifies an input electrical signal. The amplifying unit 236 may be a buffer amplifier having an amplification factor of approximately 1. Thereby, the buffer 230 supplies, to the switch control circuit 240, voltage following the voltage $V_M$ output through the intermediate terminal 38. For example, according to a control signal to cause the main switch 210 to enter a connected state, the buffer 230 supplies voltage obtained after voltage-division by the voltage divider 222. Also, according to a control signal to cause the main switch 210 to enter a disconnected state, the buffer 230 supplies first reference potential $V_{OFF}$. The buffer 230 may be a voltage follower circuit that outputs voltage of an input signal at an amplification factor of approximately 1. Also, the buffer 230 may be a circuit formed by connecting inverting amplifier circuits at two steps. The switch control circuit 240 is explained next.

Figure 5:
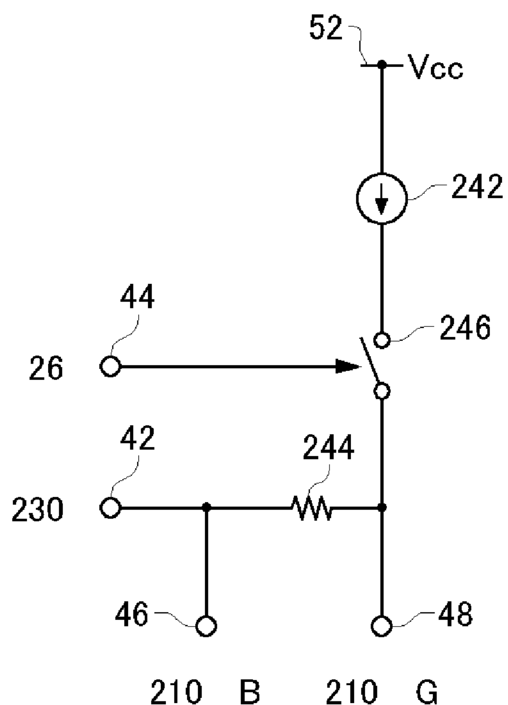
FIG. 5 shows a configuration example of a switch control circuit 240 according to the present embodiment.

FIG. 5 shows a configuration example of the switch control circuit 240 according to the present embodiment. The switch control circuit 240 has a fifth input terminal 42, a sixth input terminal 44, a second output terminal 46, a third output terminal 48, a power source unit 52, a constant-current circuit 242, a resistance 244 and a fourth sub-switch 246.

The fifth input terminal 42 is connected to the first output terminal 234 of the buffer 230, and receives an output of the buffer 230. The sixth input terminal 44 is connected with the third terminal 26 and receives an input of a control signal. The second output terminal 46 outputs a first output of the switch control circuit 240 to the bulk terminal of the main switch 210. For example, in the switch control circuit 240, the fifth input terminal 42 and the second output terminal 46 are connected, and the switch control circuit 240 supplies, as a first output, voltage approximately the same as output voltage of the buffer 230 to the bulk terminal of the main switch 210.

The third output terminal 48 outputs, to the gate terminal of the main switch 210, a second output of the switch control circuit 240. The power source unit 52 outputs predetermined voltage. The power source unit 52 may supply power source voltage of the switch apparatus 200, and in this case, supplies the voltage to each unit of the buffer 230 or the like. In the present embodiment, voltage that the switch control circuit 240 supplies to the gate terminal of the main switch 210 is first voltage, and voltage that the switch control circuit 240 supplies to the bulk terminal of the main switch 210 is second voltage.

The constant-current circuit 242 allows a predetermined current to flow. The constant-current circuit 242 has one end connected to the power source unit 52 and outputs an approximately constant current from the other end. The constant-current circuit 242 is desirably configured with a transistor or the like.

The resistance 244 generates offset voltage if current from the constant-current circuit 242 flows therethrough. The resistance 244 has one end connected to the fifth input terminal 42 and the second output terminal 46, and the other end connected to the third output terminal 48. The resistance 244 has a predetermined resistance value so that predetermined offset voltage is generated between the one end and the other end according to a current value of current that the constant-current circuit 242 causes to flow. Here, the value of the offset voltage is $V_a$.

As one example, the offset voltage $V_a$ is set to voltage equal to or higher than voltage between the gate and source (as one example, threshold voltage $V_T$) that switches the main switch 210 to a connected state. Thereby, if current from the constant-current circuit 242 flows through the resistance 244, the resistance 244 supplies the offset voltage $V_a$ between the gate terminal and bulk terminal of the main switch 210. If the main switch 210 is an n-type semiconductor switch, the switch control circuit 240 supplies positive offset voltage $V_a$.

The fourth sub-switch 246 is connected between the constant-current circuit 242 and the resistance 244, and switches whether or not to cause an approximately constant current from the constant-current circuit 242 to flow through the resistance 244 according to a control signal input through the sixth input terminal 44. That is, the fourth sub-switch 246 switches whether or not to electrically connect the other end of the constant-current circuit 242 and the other end of the resistance 244. The fourth sub-switch 246 is desirably a semiconductor switch.

The fourth sub-switch 246 electrically disconnects the constant-current circuit 242 and the resistance 244 if the main switch 210 is caused to enter a disconnected state, for example. That is, the fourth sub-switch 246 is a switch that enters a disconnected state according to a control signal to cause the main switch 210 to enter a disconnected state. Thereby, the resistance 244 does not generate offset voltage $V_a$, but makes the voltage between the gate terminal and bulk terminal of the main switch 210 approximately 0V.

Also, the fourth sub-switch 246 electrically connects the constant-current circuit 242 and the resistance 244 if the main switch 210 is caused to enter a connected state. That is, the fourth sub-switch 246 is a switch that enters a connected state according to a control signal to cause the main switch 210 to enter a connected state. Thereby, the resistance 244 generates offset voltage $V_a$, and supplies the offset voltage $V_a$ to a portion between the gate terminal and bulk terminal of the main switch 210.

As mentioned above, the switch control circuit 240 supplies, to the gate terminal of the main switch 210, gate voltage (first voltage) obtained by adding offset voltage $V_a$ to voltage from the intermediate terminal 38 if the main switch 210 is caused to enter a connected state. Also, the switch control circuit 240 supplies, to the gate terminal of the main switch 210, gate voltage (first voltage) which is equal to voltage from the intermediate terminal 38, but does not include offset voltage $V_a$ if the main switch 210 is caused to enter a disconnected state.

That is, if the gate voltage is $V_G$, $V_G$ is expressed as shown in the following equation.

$$V_G=V_M+V_a\text{(connected state)}$$

$$V_G=V_M\text{(disconnected state)} \qquad \text{(Equation 2)}$$

By assigning (Equation 1) to (Equation 2), the following equation is obtained.

$$V_G=(V_1+V_2)/2+V_a\text{(connected state)}$$

$$V_G=V_{OFF}\text{(disconnected state)} \qquad \text{(Equation 3)}$$

Here, because a voltage drop $I\cdot R_{ON}$ due to an ON-resistance $R_{ON}$ of the main switch 210 is generated if current I flows from the first terminal 22 to the second terminal 24, voltage of the first terminal 22 becomes higher than voltage of the second terminal 24 as shown in the following equation.

$$V_1=V_2+I\cdot R_{ON} \qquad \text{(Equation 4)}$$

In this case, an average voltage $V_{AVE}$ of voltage of the first terminal 22 and voltage of the second terminal 24 is calculated as shown in the following equation.

$$V_{AVE}=(V_1+V_2)/2=V_2+I\cdot R_{ON}/2 \qquad \text{(Equation 5)}$$

Gate voltage $V_G$ of the main switch 210 becomes voltage $V_{AVE}+V_a$ obtained by adding the offset voltage $V_a$ to the average voltage $V_{AVE}$. In this case, because the first terminal 22 side functions as a drain terminal and the second terminal 24 side functions as a source terminal, the gate-source voltage $V_{GS}$ of the main switch 210 is calculated as shown in the following equation.

$$V_{GS}=V_{AVE}+V_a-V_2=V_a+I\cdot R_{ON}/2 \quad \text{(Equation 6)}$$

On the other hand, because a voltage drop $I\cdot R_{ON}$ due to an ON-resistance $R_{ON}$ of the main switch 210 is generated if current I flows from the second terminal 24 to the first terminal 22, voltage of the second terminal 24 becomes higher than voltage of the first terminal 22 as shown in the following equation.

$$V_1=V_2-I\cdot R_{ON} \quad \text{(Equation 7)}$$

In this case, because the second terminal 24 side functions as a drain terminal and the first terminal 22 side functions as a source terminal, the gate-source voltage $V_{GS}$ of the main switch 210 is calculated as shown in the following equation.

$$\begin{aligned} V_{GS} &= V_{AVE}+V_a-V_1 \quad \text{(Equation 8)} \\ &= (V_1+V_2)/2+V_a-V_1 \\ &= V_a+I\cdot R_{ON}/2 \end{aligned}$$

Because (Equation 8) is the same as (Equation 6), the gate-source voltage $V_{GS}$ of the main switch 210 becomes an approximately constant voltage higher than the threshold voltage $V_T$ irrespective of the direction of a signal transmitted between the first terminal 22 and the second terminal 24. It can be known that if the ON-resistance $R_{ON}$ is taken into consideration, the gate-source voltage $V_{GS}$ undergoes a variation merely of $I\cdot R_{ON}/2$ even if a signal current I flowing between the first terminal 22 and the second terminal 24 changes, and the voltage remains approximately constant.

Also, if the main switch 210 is caused to enter a disconnected state, the switch control circuit 240 supplies first reference potential $V_{OFF}$ to the gate terminal and bulk terminal of the main switch 210. Because the first reference potential $V_{OFF}$ is potential equal to or lower than the lower limit value of the voltage range of an electrical signal that the main switch 210 transmits, the potential of the gate terminal becomes equal to or lower than potential of the first terminal 22 and the second terminal 24. That is, the gate-source voltage $V_{GS}$ of the main switch 210 becomes 0V or lower, and the main switch 210 keeps its disconnected state.

That is, the switch apparatus 200 according to the present embodiment can stably keep its disconnected state or connected state corresponding to a control signal even if the signal intensity of an input electrical signal varies. Also, because the switch apparatus 200 keeps the gate-source voltage $V_{GS}$ at an approximately constant voltage, it can reduce variations of an ON-resistance.

Also, in the switch apparatus 200, the first terminal 22 and second terminal 24 to function as input/output terminals are not connected with the bulk terminal of the main switch 210. Accordingly, even if higher harmonic noises or the like are superimposed on the constant-current circuit 242, the higher harmonic noises can be prevented from being mixed in a transmission path between the first terminal 22 and the second terminal 24 through the bulk terminal. Also, even if the main switch 210 is provided on a p-well on a substrate surface of a semiconductor substrate or the like, and a junction capacitance is formed, the first terminal 22 and the second terminal 24 can prevent the junction capacitance from becoming a load.

In this manner, because the switch apparatus 200 according to the present embodiment can reduce higher harmonic noises, and reduce variations of a load capacitance based on a junction capacitance, it can reduce distortion generated to a transmitted electrical signal, and prevent degradation of the signal waveform.

The above-mentioned switch apparatus 200 according to the present embodiment is explained as supplying, to the buffer 230, voltage obtained after dividing voltage of the first terminal 22 and voltage of the second terminal 24, the switch apparatus 200 is not limited thereto. For example, if it is known in advance through which one of the first terminal 22 and the second terminal 24 an electrical signal is input to the switch apparatus 200, the switch apparatus 200 may supply, to the buffer 230, voltage of a terminal on the side where the electrical signal is input. Such a switch apparatus 200 is explained next.

Figure 6:
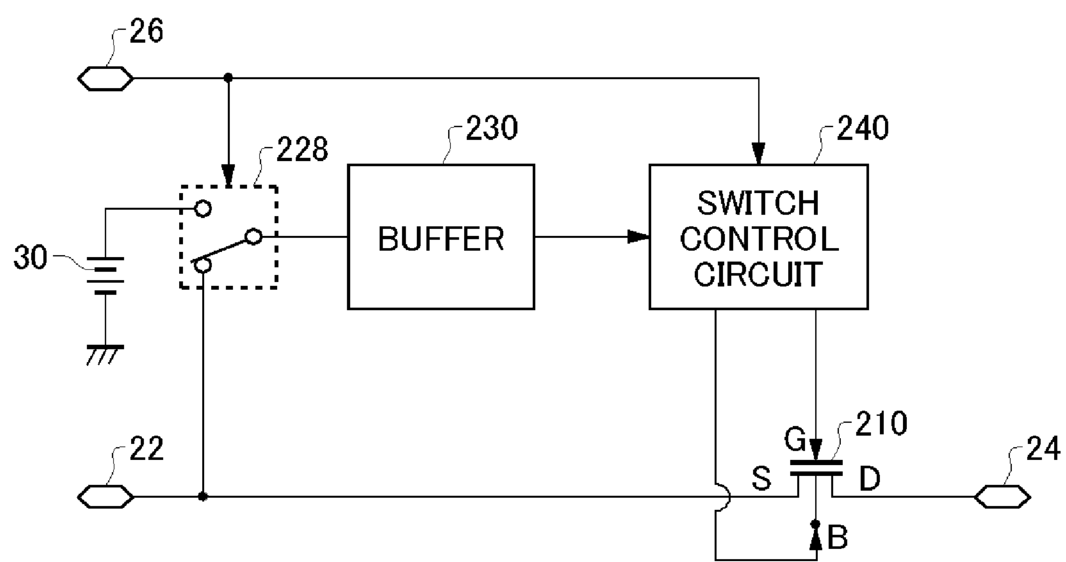
FIG. 6 shows a first variant of the switch apparatus 200 according to the present embodiment.

FIG. 6 shows a first variant of the switch apparatus 200 according to the present embodiment. In the switch apparatus 200 of the first variant, units that perform operations that are approximately the same as those of the switch apparatus 200 according to the present embodiment shown in FIG. 2 are given the same reference symbols, and explanation about them is omitted. In the example shown, in the switch apparatus 200 of the first variant, if the main switch 210 is caused to enter a connected state, an electrical signal is input through the first terminal 22. In this case, the switch apparatus 200 supplies, to the buffer 230 through the third sub-switch 228, voltage $V_1$ of the first terminal 22 through which an electrical signal is input.

That is, according to a control signal to cause the main switch 210 to enter a connected state, the third sub-switch 228 of the first variant switches to supply the voltage $V_1$ of the first terminal 22 to the buffer 230. Also, according to a control signal to cause the main switch 210 to enter a disconnected state, the third sub-switch 228 of the first variant switches to supply the first reference potential $V_{OFF}$ generated by the reference potential generating unit 30 to the buffer 230. As one example, the third sub-switch 228 of the first variant is configured with a plurality of n-channel MOSFETs.

Thereby, the buffer 230 supplies the voltage $V_1$ or first reference potential $V_{OFF}$ of the first terminal 22 to the switch control circuit 240. The switch control circuit 240 supplies, to the bulk terminal of the main switch 210, the voltage $V_1$ of the first terminal 22 and supplies, to the gate terminal, a gate voltage obtained by adding the offset voltage $V_a$ to the voltage $V_1$ of the first terminal 22 according to a control signal to cause the main switch 210 to enter a connected state. Thereby, the gate-source voltage $V_G$s of the main switch 210 becomes an approximately constant voltage exceeding the threshold voltage $V_T$, and so can keep its connected state while at the same time reducing variations of an ON-resistance.

Also, the switch control circuit 240 supplies, to the bulk terminal and gate terminal of the main switch 210, the first reference potential $V_{OFF}$ according to a control signal to cause the main switch 210 to enter a disconnected state. Because thereby even if an electrical signal is input through the first terminal 22, potential equal to or lower than the lower limit value of the voltage range of the electrical signal is supplied to the gate terminal of the main switch 210 as a gate voltage, the gate-source voltage $V_{GS}$ of the main switch 210 becomes voltage lower than the threshold voltage $V_T$. Accordingly, the main switch 210 can keep its disconnected state.

In the above-mentioned switch apparatus 200 of the first variant, the first terminal 22 and the second terminal 24 to function as input/output terminals are not connected with the bulk terminal of the main switch 210, in a similar manner to the switch apparatus 200 shown in FIG. 2. That is, because the switch apparatus 200 of the first variant can reduce higher harmonic noises, and reduce variations of a load capacitance based on a junction capacitance, it can reduce distortion generated to a transmitted electrical signal, and prevent degradation of the signal waveform. In the above-mentioned switch apparatus 200 according to the present embodiment explained as an example, the main switch 210 is an n-type semiconductor switch, but the switch apparatus 200 is not limited thereto. The main switch 210 may be a p-type semiconductor switch. Such a switch apparatus 200 is explained next.

Figure 7:
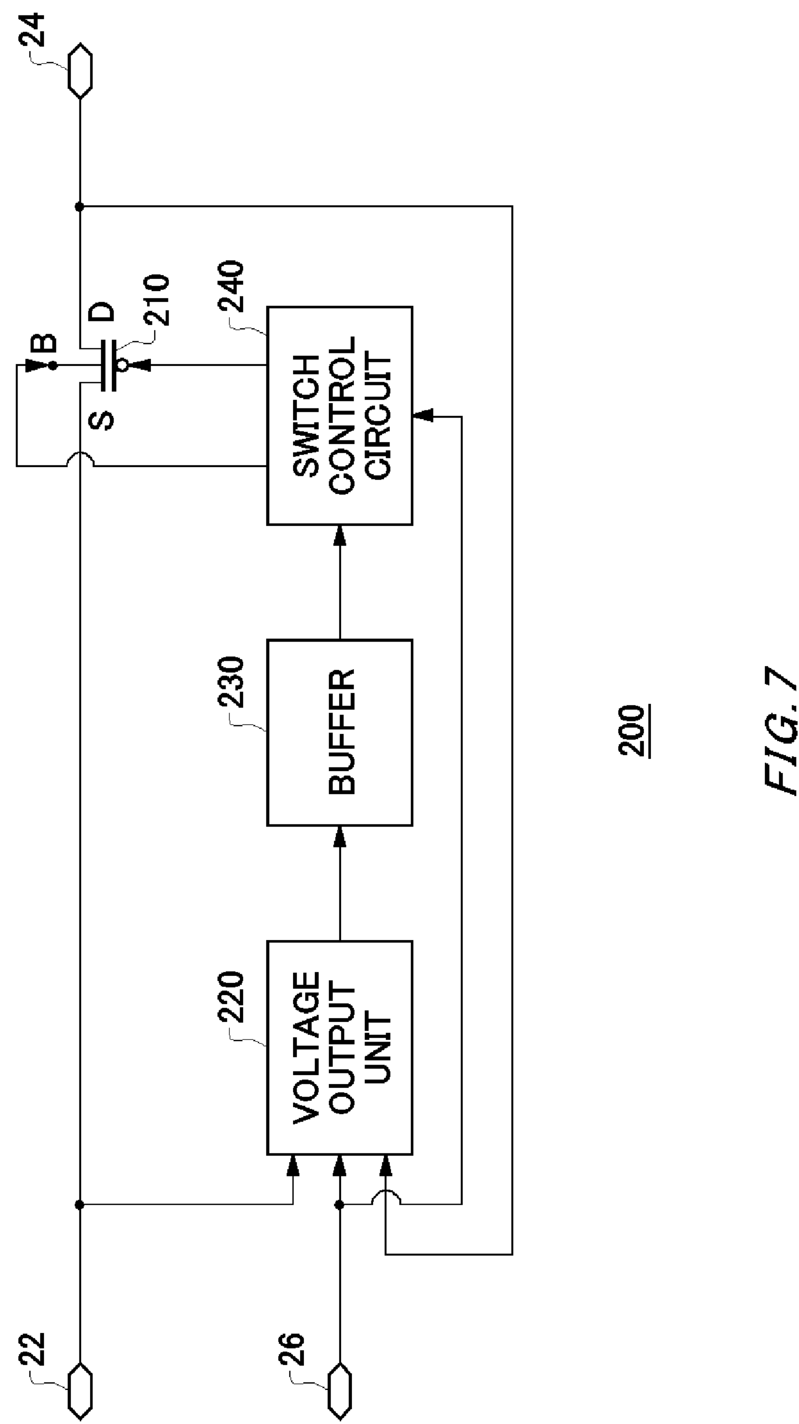
FIG. 7 shows a second variant of the switch apparatus 200 according to the present embodiment.

FIG. 7 shows a second variant of the switch apparatus 200 according to the present embodiment. In the switch apparatus 200 of the second variant shown as an example, the main switch 210 is a p-type semiconductor switch. In this case, the main switch 210 is desirably a p-channel MOSFET. Also, the main switch 210 is desirably provided in an n-well on a substrate surface. In the switch apparatus 200 of the second variant, units that perform operations that are approximately the same as those of the switch apparatus 200 according to the present embodiment shown in FIG. 2 are given the same reference symbols, and explanation about them is omitted.

The switch apparatus 200 of the second variant has approximately the same schematic configuration as the schematic configuration of the switch apparatus 200 shown in FIG. 2. Because in the switch apparatus 200, the polarity of the main switch 210 is different, the reference potential generating unit 30 of the voltage output unit 220 generates potential different from the first reference potential explained with reference to FIG. 3. The reference potential generating unit 30 generates, as the first reference potential, potential equal to or higher than the upper limit value of a voltage range of an electrical signal that the main switch 210 transmits, for example. Also, the switch control circuit 240 correspondingly has a different internal circuit configuration as well. The switch control circuit 240 of the second variant is explained next.

Figure 8:
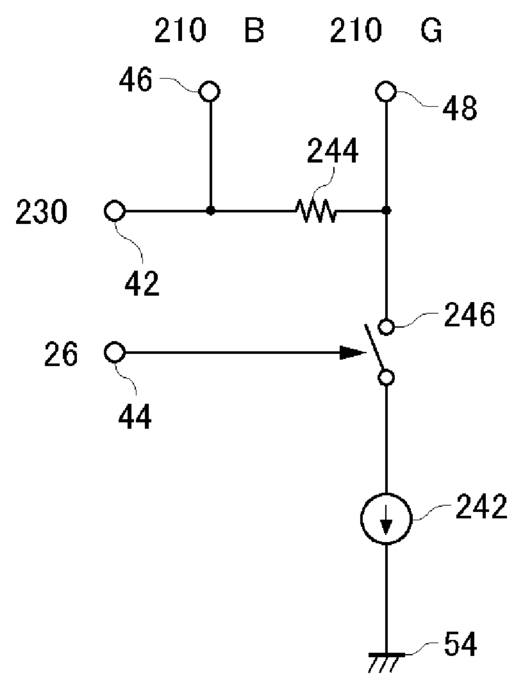
FIG. 8 shows configuration example of the switch control circuit 240 of the switch apparatus 200 of the second variant.

FIG. 8 shows a configuration example of the switch control circuit 240 of the switch apparatus 200 of the second variant. The switch control circuit 240 of the second variant has, in a similar manner to the switch control circuit 240 shown in FIG. 5, the fifth input terminal 42, the sixth input terminal 44, the second output terminal 46, the third output terminal 48, the constant-current circuit 242, the resistance 244 and the fourth sub-switch 246. The switch control circuit 240 of the second variant has second reference potential 54 in place of the power source unit 52. The second reference potential 54 is potential equal to or lower than voltage at which the gate voltage $V_a$ can be supplied to the main switch 210 for the lowest potential of an electrical signal that the main switch 210 transmits.

Because the polarity of the main switch 210 is different, the constant-current circuit 242 causes current to flow in a reverse direction to the constant-current circuit 242 of the switch control circuit 240 shown in FIG. 5. That is, the constant-current circuit 242 causes current to flow from the resistance 244 toward the constant-current circuit 242. That is, if current from the constant-current circuit 242 flows through the resistance 244, the resistance 244 supplies a negative offset voltage $V_a$ between the gate terminal and source terminal of the main switch 210. Because in this manner, the switch control circuit 240 switches whether or not to supply a negative offset voltage $V_a$ according to a control signal, it can correspondingly switch the main switch 210 of the p-type semiconductor switch to either a connected state or a disconnected state.

Figure 9:
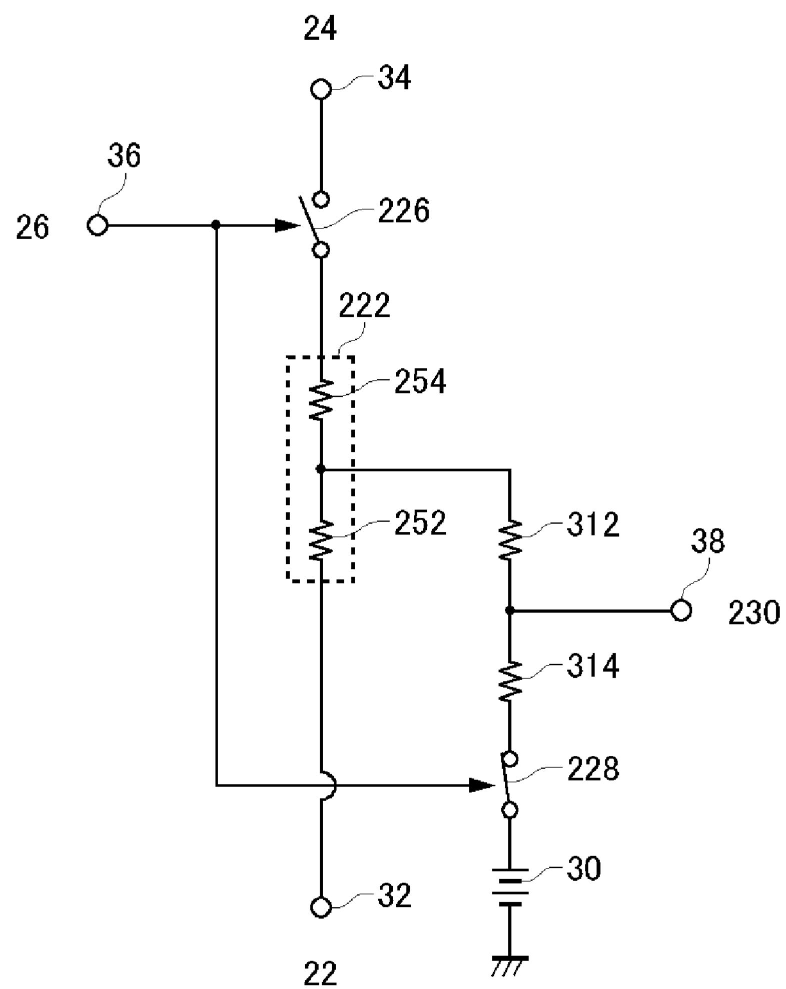
FIG. 9 shows a first variant of the voltage output unit 220 according to the present embodiment.

FIG. 9 shows a first variant of the voltage output unit 220 according to the present embodiment. In the voltage output unit 220 of the first variant, units that perform operations that are approximately the same as those of the voltage output unit 220 according to the present embodiment shown in FIG. 3 are given the same reference symbols, and explanation about them is omitted. If the main switch 210 is caused to enter a connected state, the voltage output unit 220 of the first variant outputs an average voltage of voltage of the first terminal 22 and voltage of the second terminal 24. Also, if the main switch 210 is caused to enter a disconnected state, the voltage output unit 220 of the first variant outputs voltage corresponding to either voltage of the first terminal 22 or voltage of the second terminal 24 and to the first reference potential $V_{OFF}$.

The voltage output unit 220 of the first variant has a sub-switch on at least one of the first terminal 22 side relative to an intermediate point between the first voltage-division resistance 252 and the second voltage-division resistance 254 the second terminal 24 side relative to the intermediate point. With reference to FIG. 9, an example in which a signal is transmitted from the first terminal 22 to the second terminal 24 if the main switch 210 enters a connected state is explained. As one example, the signal is a sinusoidal signal (3·sin(t) having an amplitude voltage of 3V. In this case, the first sub-switch 224 explained with reference to FIG. 3 may not be present. That is, FIG. 9 shows an example of the voltage output unit 220 that outputs voltage corresponding to voltage of the first terminal 22 and the first reference potential $V_{OFF}$ if the main switch 210 is caused to enter a disconnected state. The voltage output unit 220 may further include a first output resistance 312 and a second output resistance 314.

The first output resistance 312 has one end that is connected between the first voltage-division resistance 252 and the second voltage-division resistance 254, and the other end that outputs output voltage of the voltage output unit 220. That is, the first output resistance 312 is connected between a portion between the first voltage-division resistance 252 and the second voltage-division resistance 254 and the intermediate terminal 38. Also, the second output resistance 314 has one end that is connected to the other end of the first output resistance 312 and the other end to which the first reference potential $V_{OFF}$ is supplied. That is, the intermediate terminal 38 is connected between the first output resistance 312 and the second output resistance 314.

A resistance value $R_3$ of the first output resistance 312 and a resistance value $R_4$ of the second output resistance 314 desirably have approximately the same values. Also, a resistance value $R_1$ of the first voltage-division resistance 252 and a resistance value $R_2$ of the second voltage-division resistance 254 desirably have approximately the same values. Also, the resistance value $R_3$ of the first output resistance 312 and the resistance value $R_4$ of the second output resistance 314 desirably have values sufficiently higher than (for example, several times higher than, a dozen times higher than, or several dozen times higher than) the resistance value $R_1$ of the first voltage-division resistance 252 and the resistance value $R_2$ of the second voltage-division resistance 254, respectively. In the present embodiment, in an example explained, the resistance values of the first voltage-division resistance 252 and the second voltage-division resistance 254 are approximately the same values, the resistance values of the first output resistance 312 and the second output resistance 314 are approximately the same values, and the resistance value $R_3$ of the first output resistance 312 and the resistance value $R_4$ of the second output resistance 314 are values sufficiently higher than the resistance value $R_1$ of the first voltage-division resistance 252 and the resistance value $R_2$ of the second voltage-division resistance 254, respectively ($R_1=R_2$, $R_3=R_4$, $R_1 \ll R_3$ and $R_2 \ll R_4$).

In the voltage output unit 220 of the first variant, the third sub-switch 228 is connected between the second output resistance 314 and the reference potential generating unit 30. The third sub-switch 228 enters a disconnected state if the main switch 210 is caused to enter a connected state, and enters a connected state if the main switch 210 is caused to enter a disconnected state. That is, according to a control signal, the third sub-switch 228 switches whether or not to electrically connect the other end of the second output resistance 314 and the reference potential generating unit 30. Here, the first reference potential $V_{OFF}$ is potential to cause a diode formed between the source terminal and bulk terminal of the main switch 210 to enter an OFF-state.

Also, in the voltage output unit 220 of the first variant, the second sub-switch 226 enters a connected state if the main switch 210 is caused to enter a connected state, and enters a disconnected state if the main switch 210 is caused to enter a disconnected state. That is, because in the voltage output unit 220 of the first variant, for example, if the main switch 210 is caused to enter a connected state, the second sub-switch 226 enters a connected state, and the third sub-switch 228 enters a disconnected state, voltage obtained after voltage-division by the voltage divider 222 is output through the intermediate terminal 38.

Here, if the first voltage-division resistance 252 and the second voltage-division resistance 254 have approximately the same resistance values, similar to (Equation 1), the voltage $V_M$ output through the intermediate terminal 38 equals an average voltage of voltage of the first terminal 22 and voltage of the second terminal 24 as shown in the following equation.

$$\begin{aligned} V_M &= V_1 \cdot R_2/(R_1+R_2) + V_2 \cdot R_1/(R_1+R_2) \\ &= (V_1+V_2)/2 \text{(connected state)} \end{aligned} \quad \text{(Equation 9)}$$

Also, because in the voltage output unit 220 of the first variant, if the main switch 210 is caused to enter a disconnected state, the second sub-switch 226 enters a disconnected state, and the third sub-switch 228 enters a connected state, voltage obtained after voltage-division of the voltage $V_1$ of the first terminal 22 and the first reference potential $V_{OFF}$ at each resistance is output. Based on the relationships, $R_1=R_2$, $R_3=R_4$, $R_1 \ll R_3$ and $R_2 \ll R_4$, among the resistance value $R_1$ of the first voltage-division resistance 252, the resistance value $R_2$ of the second voltage-division resistance 254, the resistance value $R_3$ of the first output resistance 312 and the resistance value $R_4$ of the second output resistance 314, the voltage $V_M$ output through the intermediate terminal 38 is expressed as shown in the following equation.

$$\begin{aligned} V_M &= V_1 \cdot R_4/(R_3+R_4) + V_{OFF} \cdot R_3/(R_3+R_4) \\ &= (V_1+V_{OFF})/2 \text{(disconnected state)} \end{aligned} \quad \text{(Equation 10)}$$

If the above-mentioned voltage output unit 220 of the first variant is used, the gate voltage $V_G$ of the main switch 210 is calculated as shown in the following equation by assigning (Equation 9) and (Equation 10) to (Equation 2). The voltage waveform at each unit of the main switch 210 to which such a gate voltage $V_G$ is supplied is explained next.

$$V_G=(V_1+V_2)/2+V_a \text{(connected state)}$$

$$V_G=(V_1+V_{OFF})/2 \text{(disconnected state)} \quad \text{(Equation 11)}$$

Figure 10:
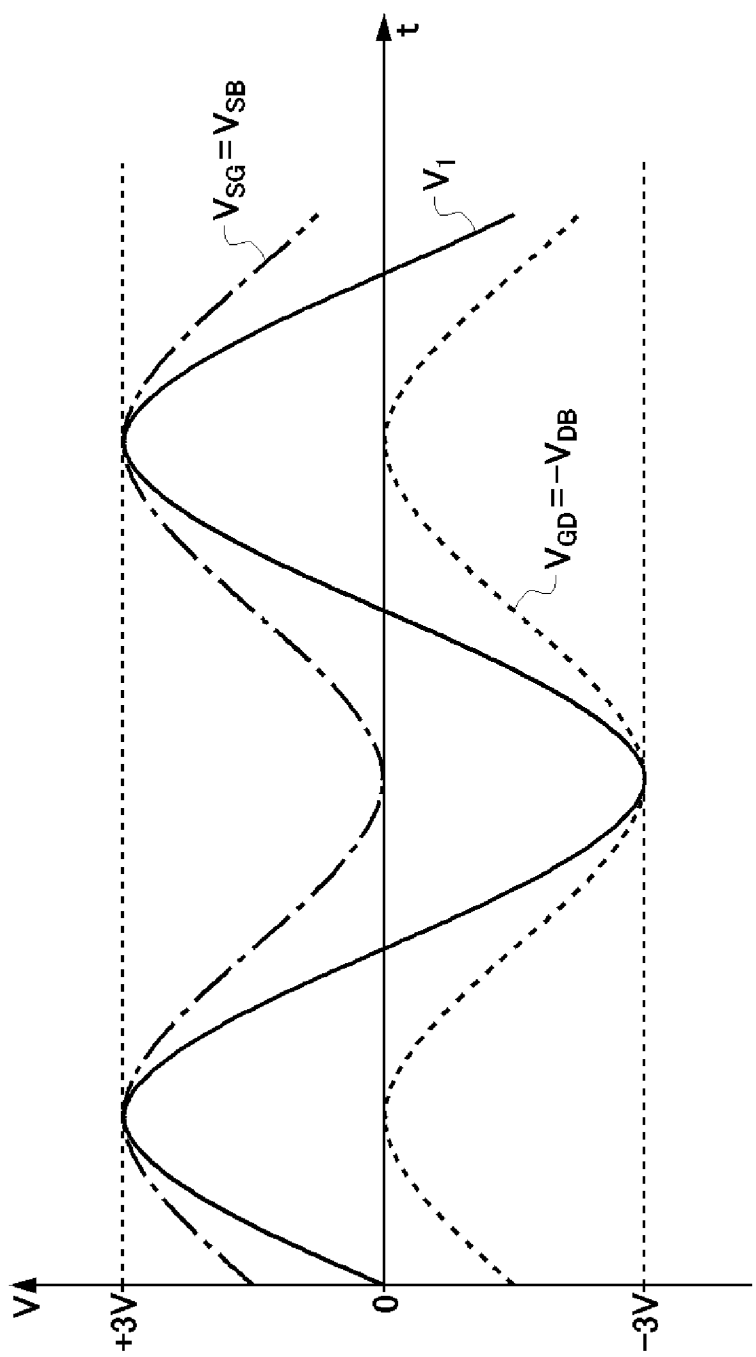
FIG. 10 shows a first example of a voltage waveform at each unit of a main switch 210 according to the present embodiment.

FIG. 10 shows a first example of a voltage waveform at each unit of the main switch 210 according to the present embodiment. The horizontal axis of FIG. 10 indicates time, and the vertical axis indicates voltage. FIG. 10 shows one example of a voltage waveform observed if a control signal to cause the main switch 210 to enter a disconnected state is supplied. Accordingly, the gate voltage $V_G$ of the main switch 210 and the voltage $V_B$ of the bulk terminal become voltage approximately equal to the voltage $V_M$ from the intermediate terminal 38.

Also, because the sinusoidal signal $V_1$ is supplied to the source terminal of the main switch 210, the source-gate voltage $V_{SG}$ is expressed as shown in the following equation.

$$V_{SG}=V_{SB}=V_1-V_M=(V_1-V_{OFF})\cdot R_3/(R_3+R_4) \quad \text{(Equation 12)}$$

Here, the source-bulk voltage is $V_{SB}$. As one example, if the voltage-division ratio between the first output resistance 312 and the second output resistance 314 is 1:1, and the first reference voltage value \T$_{OFF}$ is −3V, the source-gate voltage $V_{SG}$ is a sinusoidal signal having amplitude of 1.5V that oscillates between 0V and +3V. FIG. 10 shows such a source-gate voltage $V_{SG}$ with an alternate long and short dash line. FIG. 10 shows an electrical signal $V_1$ input through the first terminal 22 with a solid line.

Also, if voltage input through the drain terminal of the main switch 210 is $V_2$, the source-drain voltage $V_{SD}$ is expressed as shown in the following equation.

$$V_{SD}=V_1-V_2 \quad \text{(Equation 13)}$$

As one example, if the voltage $V_2$ input through the source terminal is 0V, the source-drain voltage $V_{SD}$ becomes $V_1$. That is, the source-gate voltage $V_{SG}$ becomes a sinusoidal signal having amplitude of 3V that oscillates between −3V and +3V. Such a source-gate voltage $V_{SG}$ approximately matches the solid line waveform of FIG. 10.

Also, the gate-drain voltage $V_{GD}$ of the main switch 210 is expressed as shown in the following equation. Here, the bulk-drain voltage is $V_{BD}$.

$$\begin{aligned} V_{GD} &= V_{BD} = -V_{DB} = V_M - V_2 \\ &= V_1 \cdot R_4/(R_3+R_4) + V_{OFF} \cdot R_3/(R_3+R_4) - V_2 \end{aligned} \quad \text{(Equation 14)}$$

As one example, the gate-drain voltage $V_{GD}$ becomes a sinusoidal signal having amplitude of 1.5V that oscillates between −3V and 0V. Such a gate-drain voltage $V_{GD}$ is indicated with a dotted line of FIG. 10. As mentioned above, because according to a control signal to cause the main switch 210 to enter a disconnected state, the switch apparatus 200 makes the gate-drain voltage $V_{GD}$ of the main switch 210 0V or lower, it can cause the main switch 210 to enter a disconnected state. Also, it can be known that as shown in FIG. 10, the absolute values of the inter-terminal voltage $V_{SG}$, $V_{SB}$, $V_{SD}$, $V_{SB}$ and $V_{GD}$ of the main switch 210 all become small signals of approximately 5V or lower.

As mentioned above, in the disconnected state of the main switch 210, the switch apparatus 200 according to the present embodiment sets the first reference potential to a lower limit value or lower of a voltage range of an electrical signal input through the first terminal 22. Then, the switch apparatus 200 sets the voltage-division ratio between the first output resistance 312 and the second output resistance 314 to a ratio such that the gate voltage of the main switch 210 does not exceed voltage of the second terminal 24 in a disconnected state even if voltage becomes an upper limit voltage of an electrical signal input through the first terminal 22.

Also, the switch apparatus 200 sets the voltage-division ratio between the first output resistance 312 and the second output resistance 314 such that in a disconnected state of the main switch 210, the voltage range of voltage output through the intermediate terminal 38 between the first output resistance 312 and the second output resistance 314 stays within a predetermined voltage range (as one example, a small signal voltage range of 5V or lower). Thereby, the switch apparatus 200 can make the inter-terminal voltage of the main switch 210 stay within a predetermined voltage range while at the same time making the gate-drain voltage $V_{GD}$ of the main switch 210 0V or lower.

Figure 11:
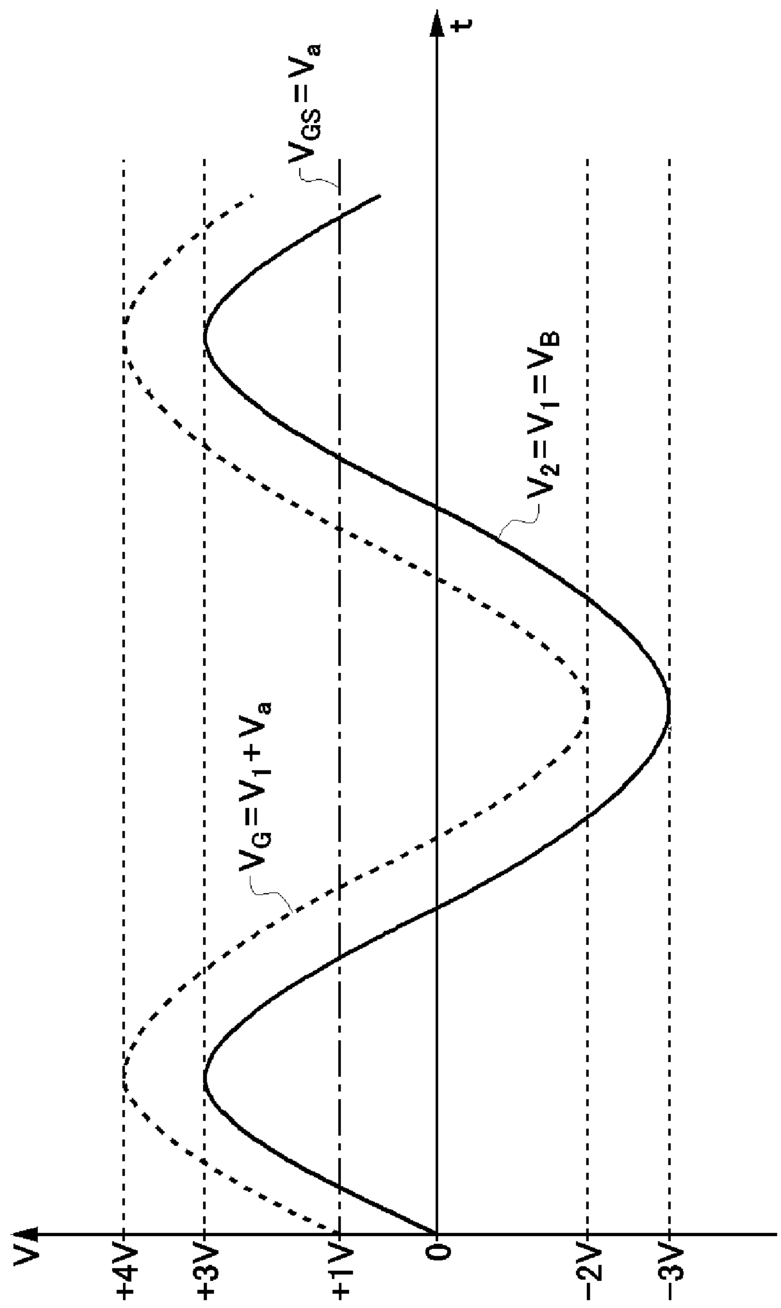
FIG. 11 shows a second example of a voltage waveform at each unit of the main switch 210 according to the present embodiment.

FIG. 11 shows a second example of a voltage waveform at each unit of the main switch 210 according to the present embodiment. The horizontal axis of FIG. 11 indicates time, and the vertical axis indicates voltage. FIG. 11 shows one example of a voltage waveform observed if a control signal to cause the main switch 210 to enter a connected state is supplied. Accordingly, the gate voltage $V_G$ of the main switch 210 becomes $V_1+V_a$, and the voltage $V_B$ of the bulk terminal becomes $V_1$. In FIG. 11, an example of the gate voltage $V_G$ of the main switch 210 is indicated with a dotted line. FIG. 11 shows an example in which the offset voltage $V_a$ is set to approximately 1V.

Also, because voltage input through the source terminal of the main switch 210 is $V_1$, the gate-source voltage $V_{GS}$ of the main switch 210 becomes $V_a$, and the main switch 210 enters a connected state. Thereby, the first terminal 22 and the second terminal 24 are electrically connected, and if the ON-resistance of the main switch 210 is sufficiently small, the voltage $V_2$ of the second terminal 24 becomes approximately the same as the voltage $V_1$ of the first terminal 22. That is, the voltage $V_1$ of the first terminal 22, the voltage $V_2$ of the second terminal 24 and the voltage $V_B$ of the bulk terminal become approximately the same voltage signals as indicated with a solid line of FIG. 11.

Because, as mentioned above, signal voltage input through the source terminal, drain terminal and bulk terminal of the main switch 210 becomes approximately equal to $V_1$, the inter-terminal voltage $V_{SB}$, $V_{DB}$ and $V_{DS}$ of the main switch 210 become approximately 0V. Also, $-V_{SG}$ becomes approximately equal to the offset voltage $V_a$. That is, it can be known that the absolute values of the inter-terminal voltage $V_{SG}$, $V_{SB}$, $V_{SD}$, $V_{DB}$ and $V_{GA}$ of the main switch 210 all become small signals of approximately 5V or lower. Accordingly, the switch apparatus 200 according to the present embodiment can make the absolute values of the inter-terminal voltage of the main switch 210 equal to or lower than a predetermined value even if the main switch 210 is caused to enter a connected state and a disconnected state.

For example, withstanding voltage of the main switch 210 can be set smaller than the difference between the upper limit value and lower limit value of the voltage range of an electrical signal input through the first terminal 22. As one example, if a sinusoidal signal having amplitude of 3V with its reference voltage at 0V is input through the first terminal 22, withstanding voltage of the main switch 210 can set lower than the difference (6V) between the upper limit value (+3V) and lower limit value (−3V) of the sinusoidal signal. That is, the switch apparatus 200 according to the present embodiment can use the main switch 110 for small signals if an electrical signal to be input is a small signal which is of as small as 5V or lower. This allows cost reduction, and also size-reduction of the switch apparatus 200.

Although the above-mentioned voltage output unit 220 of the first variant explained is exemplarily one in which an electrical signal is input through the first terminal 22, the voltage output unit 220 is not limited thereto. The voltage output unit 220 may receive an input of an electrical signal from the second terminal 24. In this case, the voltage output unit 220 has the first sub-switch 224 on the first terminal 22 side in place of the second sub-switch 226 on the second terminal 24 side. Thereby, the voltage output unit 220 can output voltage corresponding to voltage of the second terminal 24 and the first reference potential $V_{OFF}$ if the main switch 210 is caused to enter a disconnected state, and can operate the switch apparatus 200 in a similar manner to the explanation above.

As mentioned above, the voltage output unit 220 of the first variant is preferably used if it is known in advance through which one of the first terminal 22 and the second terminal 24 an electrical signal is input. That is, the voltage output unit 220 of the first variant only has to be provided with a sub-switch on a terminal which is among the first terminal 22 and the second terminal 24 and is opposite to a side where an electrical signal is input, and a sub-switch on the side where the electrical signal is input may be omitted or always in a connected state.

In contrast to this, if an electrical signal is input through both the first terminal 22 and the second terminal 24, or if it is unknown in advance which of them receives an input, the voltage output unit 220 may be provided with both the first sub-switch 224 and the second sub-switch 226. Such a voltage output unit 220 is shown next.

Figure 12:
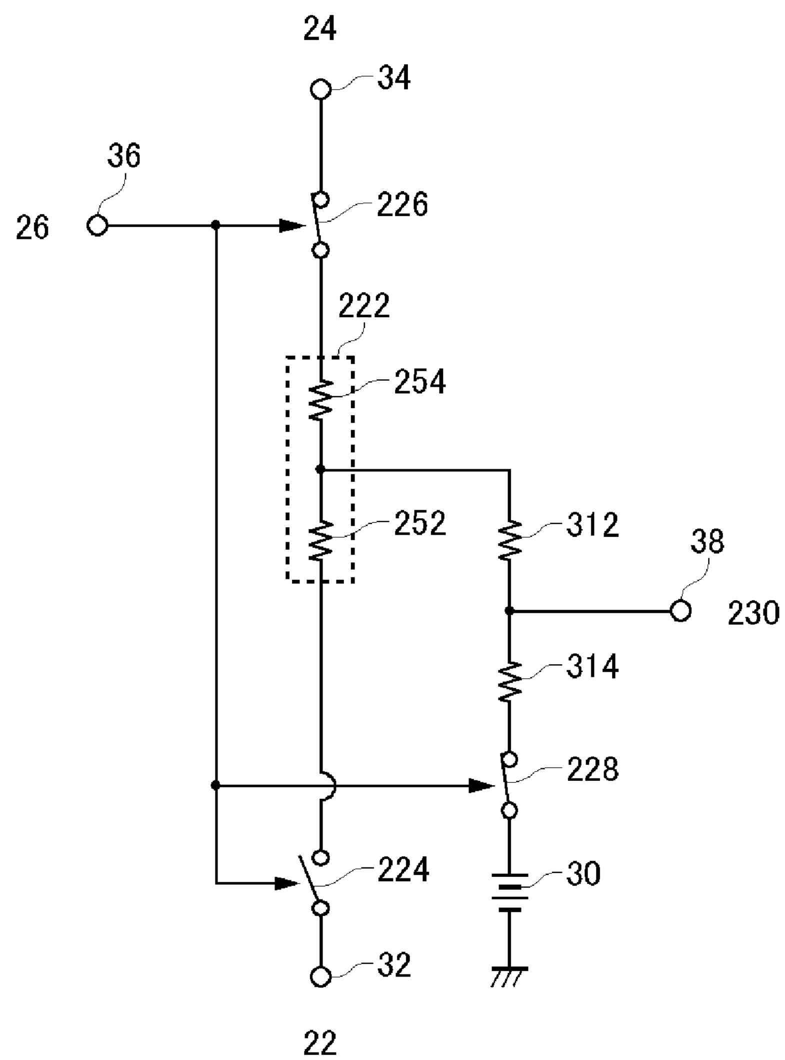
FIG. 12 shows a second variant of the voltage output unit 220 according to the present embodiment.

FIG. 12 shows a second variant of the voltage output unit 220 according to the present embodiment. In the voltage output unit 220 of the second variant, units that perform operations that are approximately the same as those of the voltage output unit 220 according to the first variant shown in FIG. 9 are given the same reference symbols, and explanation about them is omitted. The voltage output unit 220 of the second variant has the first sub-switch 224 and the second sub-switch 226.

The first sub-switch 224 is provided on the first terminal 22 side relative to the intermediate point between the first voltage-division resistance 252 and the second voltage-division resistance 254. The first sub-switch 224 may be provided between the first terminal 22 side and the first voltage-division resistance 252, and instead of this may be provided between the first voltage-division resistance 252 and the intermediate point.

The second sub-switch 226 is provided on the second terminal 24 side relative to the intermediate point between the first voltage-division resistance 252 and the second voltage-division resistance 254. The second sub-switch 226 may be provided between the second terminal 24 side and the second voltage-division resistance 254, and instead of this may be provided between the second voltage-division resistance 254 and the intermediate point.

The first sub-switch 224 and the second sub-switch 226 enter a connected state, respectively, if the main switch 210 is caused to enter a connected state. Also, the third sub-switch 228 enters a disconnected state. Thereby, the voltage output unit 220 of the second variant can output an average voltage of the voltage $V_1$ of the first terminal 22 and the voltage $V_2$ of the second terminal 24.

If the main switch 210 is caused to enter a disconnected state, when an electrical signal is input through the first terminal 22, the first sub-switch 224 enters a connected state, and the second sub-switch 226 enters a disconnected state. In this case, the voltage output unit 220 of the second variant has a circuit configuration similar to that of the voltage output unit 220 of the first variant explained with reference to FIG. 9, and as explained with reference to FIG. 10, can output, from the intermediate terminal 38, the voltage $V_M$ to cause the main switch 210 to enter a disconnected state.

Also, if the main switch 210 is caused to enter a disconnected state, when an electrical signal is input through the second terminal 24, the first sub-switch 224 enters a disconnected state, and the second sub-switch 226 enters a connected state. In this case, in the voltage output unit 220 of the second variant, as explained with reference to an example in which an electrical signal is input through the first terminal 22, the voltage output unit 220 can output voltage corresponding to voltage of the second terminal 24 and the first reference potential $V_{OFF}$, and can output, from the intermediate terminal 38, the voltage $V_M$ to cause the main switch 210 to enter a disconnected state.

As mentioned above, the voltage output unit 220 of the second variant can cause the main switch 210 to enter a disconnected state by causing a sub-switch which is among the first terminal 22 and the second terminal 24 and is opposite to a terminal through which an electrical signal is input to enter a disconnected state. Thereby, even if a terminal through which an electrical signal is input is switched, the voltage output unit 220 can control the state of the main switch 210 by selecting a sub-switch to be caused to enter a disconnected state according to an electrical signal to be input.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switch apparatus comprising:

a main switch that is connected between a first terminal and a second terminal and electrically connects or disconnects the first terminal and the second terminal according to gate voltage applied to a gate terminal;

a voltage output unit that has a voltage divider including a first voltage-division resistance on the first terminal side and a second voltage-division resistance whose one end is connected to the second terminal side, and outputs voltage corresponding to voltage of the first terminal and voltage of the second terminal in response to the main switch entering a connected state;

a buffer that outputs voltage following output voltage of the voltage output unit in a connected state of the main switch; and a switch control circuit that supplies first voltage corresponding to output voltage of the buffer to the gate terminal of the main switch, and supplies a second voltage corresponding to output voltage of the buffer to a bulk terminal of the main switch;

wherein the voltage output unit:

outputs an average voltage of voltage of the first terminal and voltage of the second terminal in response to the main switch entering a connected state, and outputs voltage corresponding to either the voltage of the first terminal or the voltage of the second terminal and to first reference potential in response to the main switch entering a disconnected state;

wherein the voltage output unit has:

a first output resistance having one end that is connected between the first voltage-division resistance and the second voltage-division resistance and another end that outputs output voltage of the voltage output unit, a second output resistance having one end that is connected to the other end of the first output resistance and another end to which the first reference potential is supplied, and a third sub-switch that is provided between the second output resistance and the first reference potential, and enters a disconnected state in response to the main switch entering a connected state, and enters a connected state in response to the main switch entering a disconnected state.

2. The switch apparatus according to claim 1, wherein the voltage output unit supplies first reference potential to an intermediate terminal between the first voltage-division resistance and the second voltage-division resistance in response to the main switch entering a disconnected state.

3. The switch apparatus according to claim 2, wherein the voltage output unit further has:

a first sub-switch that is provided between the first terminal and the first voltage-division resistance or between the intermediate terminal and the first voltage-division resistance, and enters a connected state in response to the main switch entering a connected state, and enters a disconnected state in response to the main switch entering a disconnected state; and a second sub-switch that is provided between the second terminal and the second voltage-division resistance or between the intermediate terminal and the second voltage-division resistance, and enters a connected state in response to the main switch entering a connected state, and enters a disconnected state in response to the main switch entering a disconnected state.

4. The switch apparatus according to claim 1, wherein the voltage output unit has at least one of a first sub-switch that electrically connects or disconnects a first terminal side and an intermediate point between the first voltage-division resistance and the second voltage-division resistance and a second sub-switch that electrically connects or disconnects a second terminal side and the intermediate point, and the at least one of the first sub-switch and the second sub-switch enters a connected state in response to the main switch entering a connected state, and enters a disconnected state in response to the main switch entering a disconnected state.

5. The switch apparatus according to claim 1, wherein the voltage output unit has:

a first sub-switch that electrically connects or disconnects a first terminal side and an intermediate point between the first voltage-division resistance and the second voltage-division resistance; and a second sub-switch that electrically connects or disconnects a second terminal side and the intermediate point, in response to the main switch entering a connected state, the first sub-switch and the second sub-switch enter a connected state, and in response to the main switch entering a disconnected state:

in response to an electrical signal being input through the first terminal, the first sub-switch enters a connected state and the second sub-switch enters a disconnected state; and in response to an electrical signal being input through the second terminal, the first sub-switch enters a disconnected state, and the second sub-switch enters a connected state.

6. The switch apparatus according to claim 2, wherein the first reference potential is potential that causes a diode formed between a source terminal and bulk terminal of the main switch to enter an OFF-state.

7. The switch apparatus according to claim 1, wherein the switch control circuit:

supplies, to the gate terminal, the first voltage obtained by adding non-zero offset voltage to the second voltage supplied to the bulk terminal if the main switch is caused to enter a connected state; and supplies, to the gate terminal, the first voltage which is the same as the second voltage supplied to the bulk terminal if the main switch is caused to enter a disconnected state.

8. The switch apparatus according to claim 7, wherein the main switch is an n-type semiconductor switch, and the offset voltage is a positive voltage.

9. The switch apparatus according to claim 8, wherein the main switch is provided in a p-well on a substrate surface.

10. The switch apparatus according to claim 7, wherein the main switch is a p-type semiconductor switch, and the offset voltage is a negative voltage.

11. The switch apparatus according to claim 10, wherein the main switch is provided in an n-well on a substrate surface.

12. The switch apparatus according to claim 1, wherein the first reference potential is potential that causes a diode formed between a source terminal and bulk terminal of the main switch to enter an OFF-state.

13. The switch apparatus according to claim 1, wherein the second voltage-division resistance is provided between the second terminal and the first voltage-division resistance.

* * * * *